US 6,727,130 B2

(12) United States Patent
Kim et al.

(10) Patent No.: US 6,727,130 B2
(45) Date of Patent: Apr. 27, 2004

(54) METHOD OF FORMING A CMOS TYPE SEMICONDUCTOR DEVICE HAVING DUAL GATES

(75) Inventors: Woo-Sik Kim, Kyunggi-do (KR); Nae-In Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 173 days.

(21) Appl. No.: 10/006,093

(22) Filed: Dec. 6, 2001

(65) Prior Publication Data
US 2002/0151125 A1 Oct. 17, 2002

(30) Foreign Application Priority Data
Apr. 11, 2001 (KR) ......................... 2001-19304

(51) Int. Cl.$^7$ ............................ H01L 21/238
(52) U.S. Cl. ................................. 438/199
(58) Field of Search ................ 438/199, 275, 438/217

(56) References Cited

U.S. PATENT DOCUMENTS

| | | | | |
|---|---|---|---|---|
| 5,432,114 A | * | 7/1995 | O | |
| 5,716,863 A | * | 2/1998 | Arai | |
| 5,723,357 A | * | 3/1998 | Huang | |
| 5,923,984 A | * | 7/1999 | Gardner et al. | 438/289 |
| 6,033,958 A | * | 3/2000 | Chou et al. | 438/275 |
| 6,048,769 A | * | 4/2000 | Chau | 438/275 |
| 6,100,204 A | * | 8/2000 | Gardner et al. | 438/765 |
| 6,130,123 A | * | 10/2000 | Liang et al. | 438/217 |
| 6,165,918 A | * | 12/2000 | Jia et al. | 438/981 |
| 6,211,025 B1 | * | 4/2001 | Gardner et al. | 438/300 |
| 6,258,643 B1 | * | 7/2001 | Hsu | 438/199 |
| 6,362,059 B2 | * | 3/2002 | Fukasaku et al. | 438/289 |

* cited by examiner

Primary Examiner—Long Pham
(74) Attorney, Agent, or Firm—Mills & Onello LLP

(57) ABSTRACT

A method of forming a CMOS type semiconductor device having dual gate includes forming a first gate insulation layer and a first metal-containing layer sequentially on a surface of a substrate in first and second impurity type transistor regions, removing the first metal-containing layer and the first gate insulation layer in the second impurity type transistor region, forming a second gate insulation layer and a second metal-containing layer in the second impurity type transistor region, and forming first and second electrodes in the first and second impurity type transistor regions, respectively, by patterning the first and second metal-containing layers. When first and second impurities in the transistor regions are p-type and n-type impurities, respectively, a fermi level of the first metal-containing layer has an energy level similar to the valence band of the silicon layer in the first impurity type transistor region heavily doped by a p-type impurity, and a fermi level of the second metal-containing layer has an energy level similar to the conduction band of the silicon layer in the second impurity type transistor region heavily doped by an n-type impurity.

15 Claims, 7 Drawing Sheets

METHOD OF FORMING A CMOS TYPE SEMICONDUCTOR DEVICE HAVING DUAL GATES

This application relies for priority upon Korean Patent Application No. 2001-19304, filed on Apr. 11, 2001, the contents of which are herein incorporated by reference in their entirety.

FIELD OF THE INVENTION

The present invention relates to a method of forming a complementary metal oxide silicon (CMOS) type semiconductor device having dual gates.

BACKGROUND OF THE INVENTION

A CMOS type semiconductor device is a device in which p-channel metal oxide semiconductor (PMOS) transistors along with n-channel metal oxide semiconductor (NMOS) transistors are formed to work cooperatively with each other. In the CMOS type semiconductor device, operation efficiency and speed are greatly improved as compared with a semiconductor device using only PMOS transistors and characteristic of bipolar transistors is presented. Accordingly, CMOS devices are commonly used in high performance semiconductor devices. In recent years, as the elements incorporated into devices are integrated to a high degree and minimized to increase the voltage characteristic and speed thereof, a dual gate type CMOS semiconductor device in which p-type and n-type impurities are implanted in polysilicon gates of corresponding impurity type transistor regions has been proposed and widely used. The dual gate type CMOS semiconductor device has the advantages of reinforcing the function of surface layer portions of channels and enabling symmetrical low voltage operation.

However, in the CMOS type semiconductor device having polysilicon gates, a thin depletion layer is formed between the polysilicon gates and a gate insulation layer since the operation voltage applied to the gates is contrary to the impurity type of the polycrystalline silicon gates. Particularly, as thickness of the gate insulation layer is decreased, a depletion of the polysilicon gate is intensified.

In the MOS transistors of the CMOS type semiconductor device, it is required that the gate insulation layer be formed to be relatively thin, for example, about 10 Å, according to the conditions. Accordingly, the depletion of the polysilicon gate becomes more of an issue. For example, when boron ions escape from a polysilicon layer forming the gate, a boron concentration in the polysilicon layer adjacent to the gate insulating layer is reduced to raise a poly-gate depletion effect (PDE). Supposing that the PDE occurs and thereby the polysilicon gate forms an electric insulation layer of 3 Å at a lower end thereof, the gate insulation layer comes to be formed several ten percent as thick as the required thickness.

Specifically, when the gates of the PMOS transistors among the CMOS transistors are formed during the fabrication of the high performance dual poly-gate type CMOS semiconductor device, boron is usually used as a dopant implanted in the polysilicon gate layer. However, a problem that the boron is diffused and escaped into the channels through the thin gate insulating layer as well as that it is insufficiently implanted or activated may occur. That is, if the boron ions are discharged from the polysilicon gate layer during the impurity implantation, the boron concentration in the polysilicon gate layer adjacent to the gate insulating layer is reduced and thereby the PDE is more intensified.

To prevent the PDE, there has been proposed a method of using a metal gate instead of the polysilicon gate. When the metal gate instead of the polysilicon gate is used as a gate electrode, the PDE does not occur. Also, the resistance of gate lines can be reduced, thereby reducing the signal distortion due to the resistance-capacitor (RC) delay.

However, in this case, since the threshold voltage of the single metal gate can be increased and the metal elements can be diffused through the gate insulation layer, the reliability of the gate insulation layer is deteriorated. Thus, in the semiconductor device in which the threshold voltage should be reduced for purposes of low power consumption and high speed operation, using the metal gate may introduce drawbacks.

The threshold voltage problem usually occurs since the same type of metal is used as the gate metal in both the PMOS and NMOS transistor regions of the CMOS type semiconductor device. For example, when the metal of one kind having a fermi level between energy levels of conduction and valence bands of the semiconductor layer is used as a gate metal, the threshold voltage is increased about 0.5V compared with the dual poly-gate even though the metal has the same impurity and concentration as that of a doped channel layer.

To reduce the threshold voltage when using the metal of one kind as a gate metal, a method of doping an impurity of a type different than that of a channel dopant additionally in the doped channel layer can be considered. In the method, the threshold voltage is decreased, but the channels are formed in a body as well as a surface, thereby deteriorating the characteristics of the device.

Accordingly, a method of using metals of two kinds having different fermi levels or work functions instead of a single metal as gate electrodes in the PMOS and NMOS transistor regions has been proposed. In the method, a metal having a fermi level similar to the energy level of the conduction band of the silicon layer doped by an $n^+$-type impurity is used as gate electrodes in the NMOS transistor region, and a metal having a fermi level similar to the energy level of the valence band of the silicon layer doped by a $p^+$-type impurity is used as gate electrodes in the PMOS transistor region.

FIG. 1 to FIG. 4 are cross-sectional views illustrating a conventional method of forming gate electrodes of different metals in first and second impurity type transistor regions. Referring to FIG. 1, first and second transistor regions 14, 12 and an isolation layer 16 are formed to define element regions in a surface of a substrate 10. A gate insulation layer 18 and a gate layer 20 are then formed on the surface of the substrate 10. And then, the first gate layer 20 is removed from the surface of the substrate 10 in the second impurity transistor region 12. A portion 21 of the first gate layer 20 on the surface of the substrate 10 in the first impurity transistor region 14 remains, as shown in FIG. 2. Thereafter, as shown in FIG. 3, a second gate layer 30 is formed over the surface of the substrate 10 in the second impurity type transistor region 12. To form gate electrodes 23, 33, the remaining portion 21 of the first gate layer 20 and the second gate layer 30 over the surface of the substrate 10 in the first and second impurity type transistor regions 14, 12 are patterned. However, in the process described above, when the first gate layer 20 is partially removed, the gate insulation layer 18 to be positioned below the second gate layer is apt to be damaged. As a result, the characteristics of the second impurity type transistors may deteriorate.

SUMMARY OF THE INVENTION

Therefore, it is an object of the present invention to provide an improved method of forming a CMOS type semiconductor device which can prevent a poly-gate depletion effect (PDE).

It is another object of the present invention to provide an improved method of forming a CMOS type semiconductor device which can prevent the PDE and at the same time, decrease a threshold voltage of transistors to drive them in a high speed and a low power consumption.

It is other object of the present invention to provide an improved method of forming a CMOS type semiconductor device which can enhance the reliability of a gate insulation layer.

The present invention is directed to a method of forming a CMOS type semiconductor device. In accordance with the method, a first gate insulation layer and a first metal-containing layer are formed sequentially on a surface of a substrate in first and second impurity type transistor regions on which an isolation layer is formed. The first gate insulation layer on the surface of the substrate in the second impurity type transistor region is exposed by selectively etching the first metal-containing layer anisotropically. The first gate insulation layer on the surface of the substrate is removed in the second impurity type transistor region. A second gate insulation layer is formed on the surface of the substrate in the second impurity type transistor region. A second metal-containing layer is formed over the surface of the substrate on which the second gate insulation layer is formed. A first gate electrode is formed on the surface of the substrate in the first impurity type transistor region by patterning the first metal-containing layer. A second gate electrode is formed on the surface of the substrate in the second impurity type transistor region by patterning the second metal-containing layer.

In one embodiment, the first and second metal-containing layers can include a conductive nitride or oxide layer as well as a pure metal layer. Also, the first and second gate insulation layers can be formed by oxidizing the substrate thermally. Alternatively, the gate insulation layers can be formed of silicon nitrides or insulation metal oxides having a high dielectric constant with the relative dielectric constant in the range of more than 10, by a method such as a chemical vapor deposition (CVD), a sputtering, an atomic layer deposition (ALD) or the like. Accordingly, when the second gate insulation layer is formed through the thermal oxidation and the insulation oxides are not formed on the first metal-containing layer, the first gate electrode comes to have a shape in which the second metal-containing layer is stacked on the first metal-containing layer. That is, when the first gate electrode is formed by patterning the first metal-containing layer, the first gate electrode can be formed through a patterning at a state which does not remove the second metal-containing layer on the first metal-containing layer.

The method of the invention further includes forming a layer of a metal such as a tungsten or aluminum to increase the conductivity of the gate electrodes after the step of forming a second metal-containing layer. Also, the steps of forming first and second gate electrodes can be concurrently carried out through the same patterning process.

In the embodiment, when first and second impurities in the first and second impurity type transistor regions are p-type and n-type impurities, respectively, the channel layers in the first and second impurity type transistor regions are respectively n-type and p-type impurities. In this case, preferably, a fermi level of the first metal-containing layer has an energy level, for example in the range of less than 0.2V, similar to the valence band of the silicon layer in the first impurity type transistor region doped by a p$^+$-type impurity, and a fermi level of the second metal-contained layer has an energy level, for example in the range of less than 0.2V, similar to the conduction band of the silicon layer in the second impurity type transistor region doped by an n$^+$-type impurity.

Also, the step of removing the first gate insulation layer can be carried out by a wet or dry etching process.

BRIEF DESCRIPTION OF THE DRAWINGS

The foregoing and other objects, features and advantages of the invention will become more apparent from the following detailed description of preferred embodiments thereof made with reference to the attached drawings. Like numbers refer to like elements throughout.

DETAILED DESCRIPTION OF PREFERRED EMBODIMENTS

The present invention now will be described more fully hereinafter with reference to the accompanying drawings, in which preferred embodiments of the invention are shown.

Embodiment 1

Figure 1:
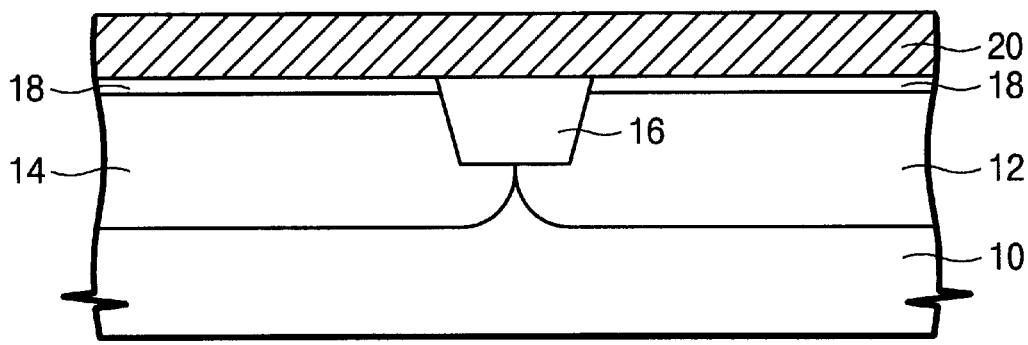
FIG. 1 to FIG. 4 are cross-sectional views illustrating the process steps of a conventional method of forming a CMOS type semiconductor device having dual gate.
Figure 2:
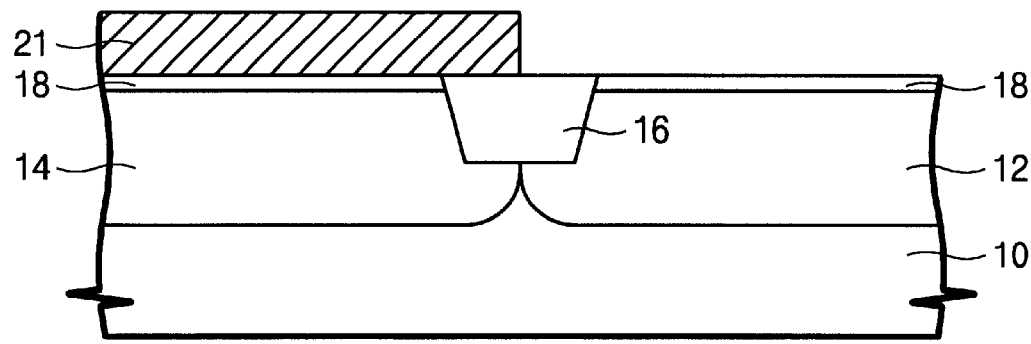
Figure 3:
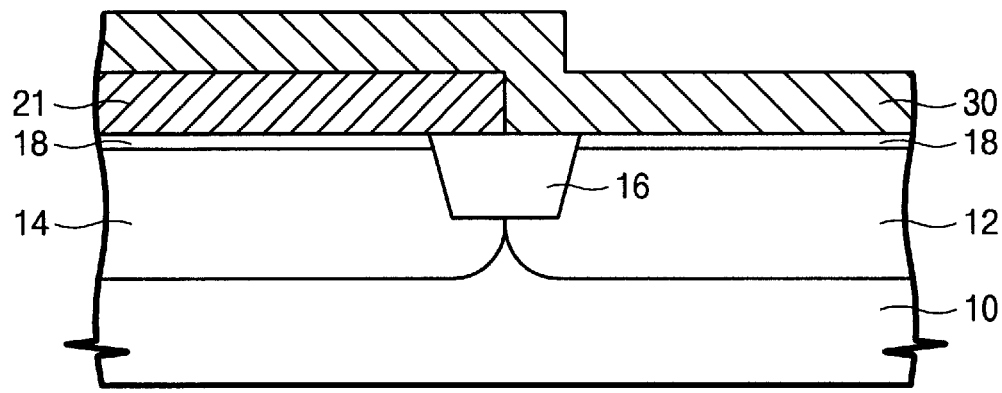
Figure 4:
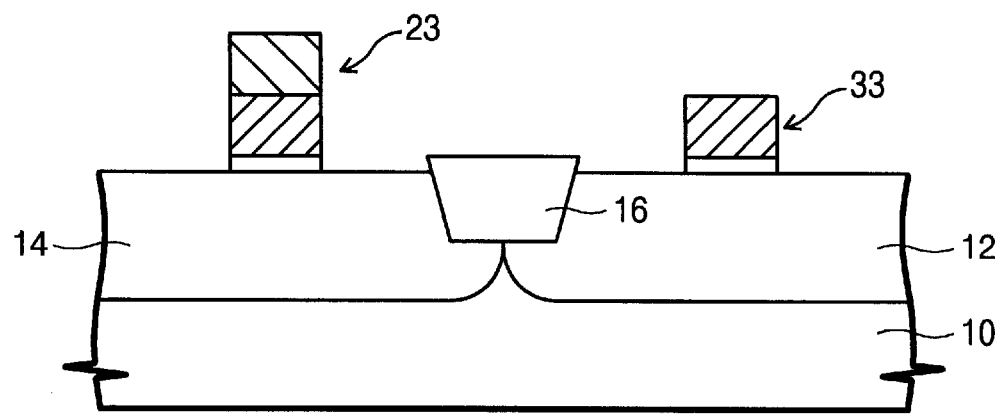
Figure 5:
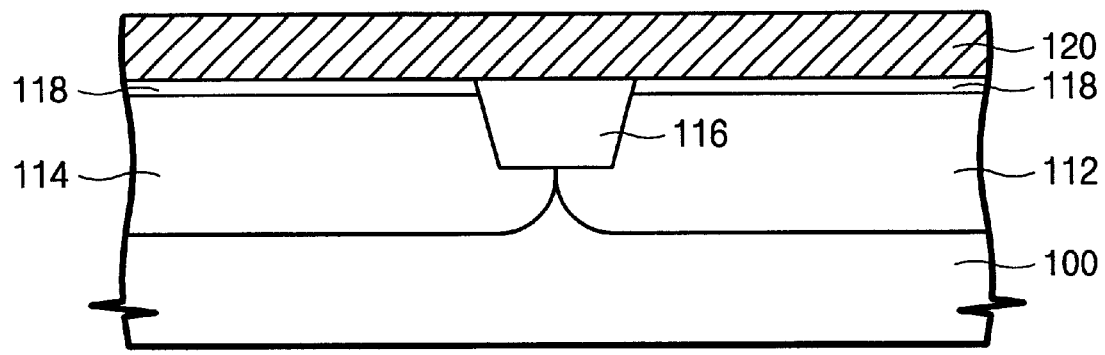
FIG. 5 to FIG. 8 are cross-sectional views illustrating the process steps of a method of forming a CMOS type semiconductor device having dual gate in accordance with an embodiment of the present invention.

FIG. 5 to FIG. 8 are cross-sectional views illustrating the process steps of a method of forming a CMOS type semiconductor device in accordance with a first embodiment of the present invention. Referring now to FIG. 5, impurity wells, i.e., PMOS and NMOS transistor regions 114, 112, are formed in a surface of a silicon substrate 100 by ion implantations corresponding to each region. An isolation layer 116 is then formed on the surface of the substrate 100 to define element regions. And then, a gate insulation layer 118 is formed of a thermal oxidation layer on the surface of the substrate 100 on which the isolation layer 116 is formed. Instead of the thermal oxidation layer, a silicon nitride layer as the gate insulation layer 118 can be formed by carrying out a heat treatment in a nitrogen atmosphere. The gate insulation layer 118 is thinly formed to a thickness of 10 to several tens of angstroms (Å). Over the whole surface of the substrate 100 on which the gate insulation layer 118 is formed, a tungsten nitride layer 120 is deposited by a chemical vapor deposition (CVD) method. The tungsten nitride layer 120 can be replaced with a layer containing a different metal material which has a fermi level similar to the energy level of the valence band of the silicon layer in the PMOS transistor region 114 doped by a P$^+$-type impurity.

Figure 6:
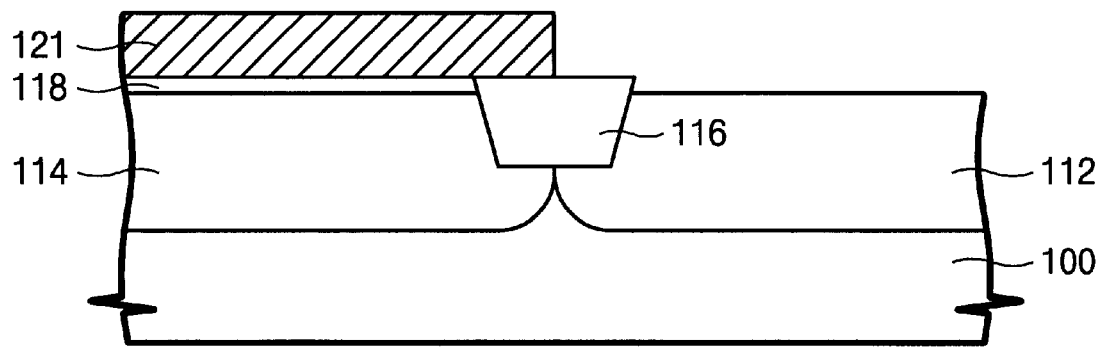

Referring to FIG. 6, a photo-resist etch mask (not shown) is formed on the tungsten nitride layer 120. The tungsten nitride layer 120 over the surface of the substrate 100 in the NMOS transistor region 112 is then removed through an anisotropic dry etching process such as a reactive ion etching (RIE) process which uses the photo-resist as an etch mask. The gate insulation layer 118 on the surface of the substrate 100 in the NMOS transistor region 112 is then removed through a wet etching. The wet etching acts to prevent the substrate 100 positioned below the gate insulation layer 118 from being damaged. The gate insulation layer 118 can be removed by a thin hydrofluoric acid or a detergent having an etch selectivity with respect to a silicon oxide layer.

Figure 7:
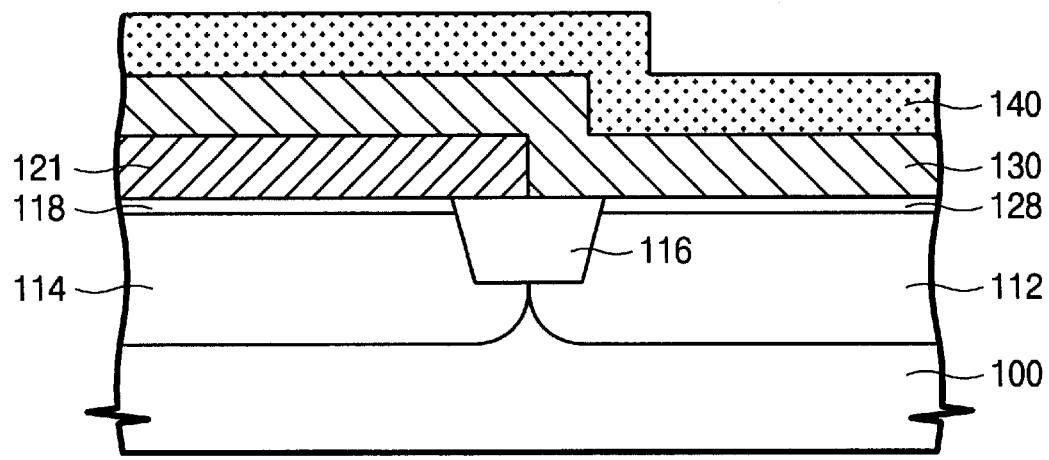

Referring to FIG. 6 and FIG. 7, a thermal oxidation is carried out to the substrate 100 in which the gate insulation layer 118 and the tungsten nitride layer 121 remain only on the surface thereof in the PMOS transistor region 114. In the thermal oxidation, the process temperature is so controlled that a nonconductor such as an oxide layer is not formed on a surface of the remaining tungsten nitride layer 121 and a thermal oxidation layer as a gate insulation layer 128 is formed on an exposed surface of the substrate 100 in the NMOS transistor region 112. Instead of the thermal oxidation layer, a silicon nitride layer as the gate insulation layer 128 can be formed by carrying out a heat treatment in a nitrogen atmosphere. In this case, the silicon nitride layer is formed only on the exposed surface of the substrate 100 in the NMOS transistor region 112 and the tungsten nitride layer 121 is preserved.

Next, a molybdenum (Mo) layer 130 for forming gate electrodes on the surface of the substrate 100 in the NMOS transistor region 112 is formed over the whole surface of the substrate 100 through a sputtering method. The Mo layer 130 can be replaced with a layer containing a different metal material which has a fermi level similar to the energy level of the conduction band of the silicon layer in the NMOS transistor region 112 doped by an $N^+$-type impurity. On the Mo layer 130, a tungsten layer 140 which has a good conductivity and is apt to be joined with the lower Mo layer 130 is formed through the sputtering method. Alternatively, a tungsten contained in the tungsten layer 140 can be replaced with an aluminum.

Figure 8:
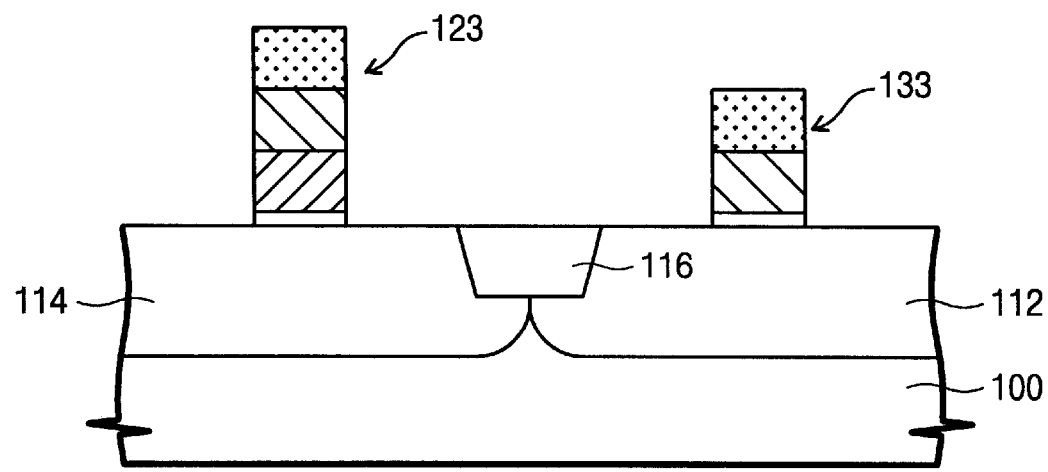

Referring to FIG. 7 and FIG. 8, a photo-resist pattern (not shown) is formed on the tungsten layer 140. The tungsten layer 140, the Mo layer 130, the tungsten nitride layer 121 and the gate insulation layers 118, 128 are then sequentially etched to form gate electrodes 123, 133 using the photo-resist pattern as an etch mask. Consequently, on the surface of the substrate 100 in the PMOS transistor region 114, the gate electrodes 123 in which the tungsten nitride layer 121, the Mo layer 130, and the tungsten layer 140 are sequentially stacked are formed, and on the surface of the substrate 100 in the NMOS transistor region 112, the gate electrodes 133 in which the Mo layer 130 and the tungsten layer 140 are sequentially stacked are formed.

Next, the surface of the substrate 100 in the NMOS and PMOS transistor regions 112, 114 can be lightly implanted with n-type and p-type impurities, respectively. Spacers are then formed on side walls of the gate electrodes. The spacers are concurrently formed in the NMOS and PMOS transistor regions. And then, the surface of the substrate in the NMOS and PMOS transistor regions is heavily implanted with the n-type and p-type impurities, respectively. Consequently, source/drain regions having a lightly doped drain (LDD) or dual doped structure are obtained.

Embodiment 2

FIG. 9 to FIG. 13 are cross-sectional views illustrating the process steps of a method of forming a CMOS type semiconductor device in accordance with a second embodiment of the present invention.

Figure 9:
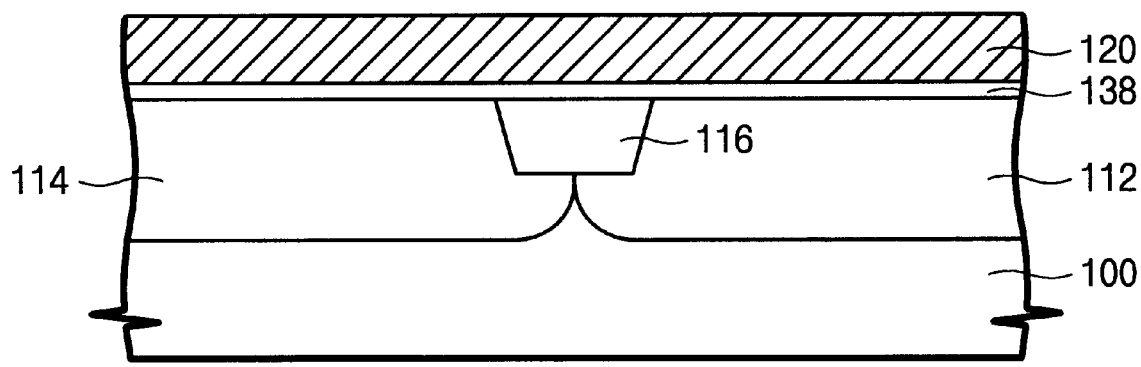
FIG. 9 to FIG. 13 are cross-sectional views illustrating the process steps of a method of forming a CMOS type semiconductor device having dual gate in accordance with another embodiment of the present invention.

Referring now to FIG. 9, impurity wells, i.e., PMOS and NMOS transistor regions 114, 112, are formed in a surface of a substrate 100 by carrying out ion implantations corresponding to each region. An isolation layer 116 is then formed on the surface of the substrate 100 to define element regions. And then, a first gate insulation layer 138 is formed on the surface of the substrate 100 on which the isolation layer 116 is formed. The first gate insulation layer 138 can be formed by depositing a high dielectric layer having a relative dielectric constant higher than that of a silicon oxide layer by a method such as a CVD, a sputtering, an ALD and the like. The high dielectric layer can be formed of a material selected from $Al_2O_3$, $HfO_2$, $HfSiO_4$, $ZrO_2$, $ZrSiO_4$, and $La_2O_3$. A thickness of the gate insulation layer 138 is different according to the relative dielectric constant, but it is preferably in the range of less than 100 Å. Over the whole surface of the substrate 100 on which the first gate insulation layer 138 is formed, a first metal-containing layer 120 is formed. The first metal-containing layer 120 can be formed of a layer containing a metal material such as $RuO_2$, WN, Pt, Ir, and Ni which has a fermi level similar to the energy level of the valence band of the silicon layer in the PMOS transistor region 114 doped by a $P^+$-type impurity.

Figure 10:
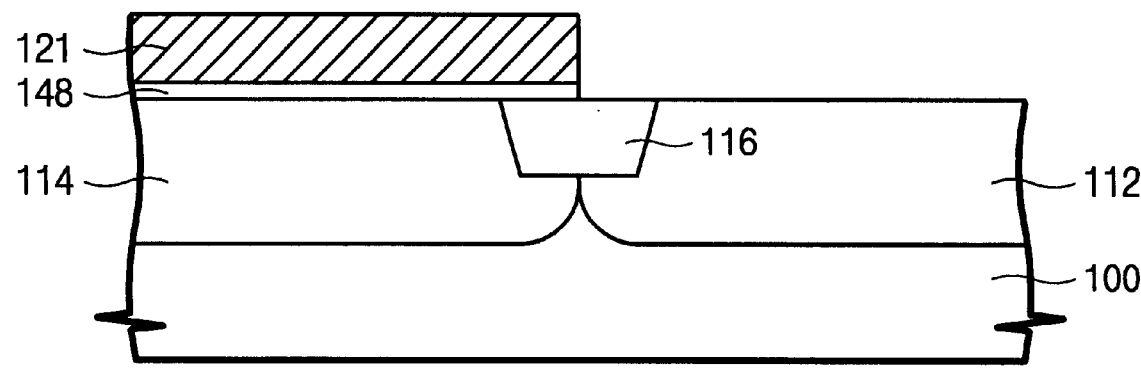

Referring to FIG. 9 and FIG. 10, a photo-resist etch mask (not shown) is formed on the first metal-containing layer 120. The first metal-containing layer 120 over the surface of the substrate 100 in the NMOS transistor region 112 is then removed through an anisotropic dry etching process such as a reactive ion etching (RIE) process which uses the photo-resist etch mask as an mask. And then, the first gate insulation layer 138 on the surface of the substrate 100 in the NMOS transistor region 112 is removed through a wet etching process.

Figure 11:
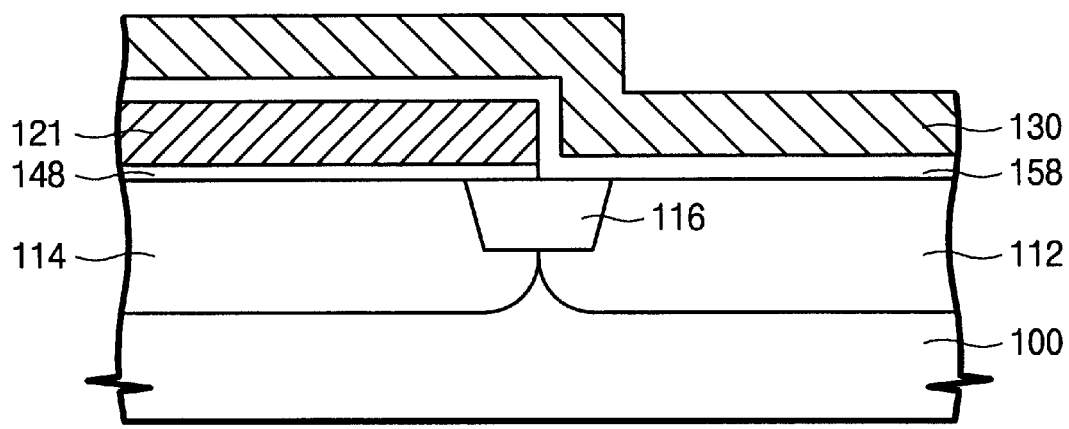

Referring to FIG. 10 and FIG. 11, a second gate insulation layer 158 is formed over the whole surface of the substrate 100, in which the first gate insulation layer 148 and the first metal-containing layer 121 remain only on the surface thereof in the PMOS transistor region 114. The second gate insulation layer 158 can be formed of a layer of material different from that of the first gate insulation layer 148.

Next, a second metal-containing layer 130 for forming gate electrodes on the surface of the substrate 100 in the NMOS transistor region 112 is formed over the whole surface of the substrate 100. The second metal-containing layer 130 can be formed of a layer containing a metal material such as Ta, Zr, Hf and Ti which has a fermi level similar to the energy level of the conduction band of the silicon layer in the NMOS transistor region 112 doped by an $N^+$-type impurity.

Figure 12:
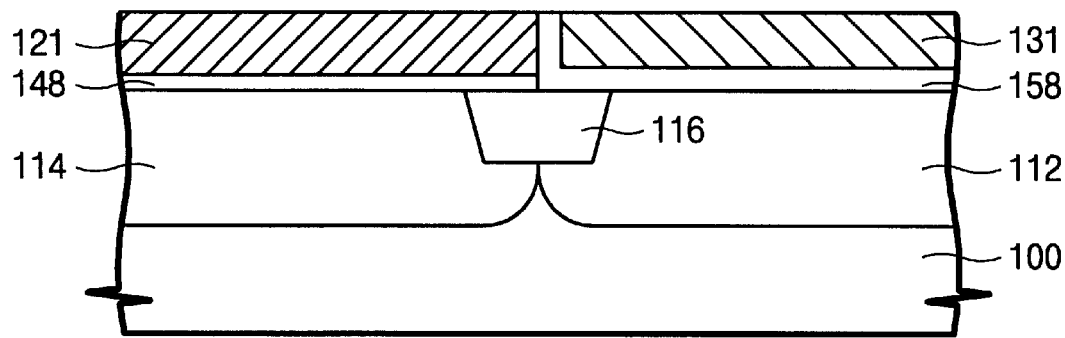

Referring to FIG. 11 and FIG. 12, a photo-resist (not shown) is formed over the whole surface of the substrate 100 and a photo-resist pattern (not shown) exposing the second metal-contained layer 130 over the surface of the substrate 100 in the PMOS transistor region 114 is then formed. The second metal-containing layer 130 over the surface of the substrate 100 in the PMOS transistor region 114 is then removed through an etching which uses the second gate insulation layer 158 as an etch stop layer. And then, the second gate insulation layer 158 used as an etch stop layer is removed through an etching. Thereafter, the photo-resist pattern is removed. Consequently, on the surface of the substrate 100 in the PMOS transistor region 114, the first gate insulation layer 148 and the first metal-containing layer 121 remain and on the surface of the substrate 100 in the NMOS transistor region 112, the second gate insulation layer 158 and the second metal-containing layer 131 remain.

Figure 13:
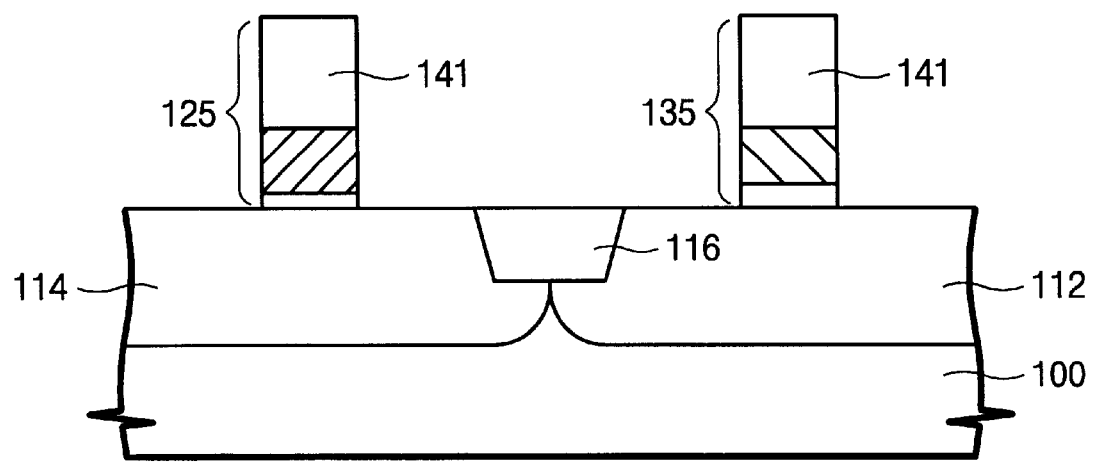

Referring to FIG. 12 and FIG. 13, to increase the conductivity of gate electrodes, a metal layer 141 such as a tungsten or aluminum layer is formed over the whole surface of the substrate 100. Then, on the surface of the substrate 100 in the PMOS transistor region 114, the metal layer 141 and the first metal-containing layer 121 are sequentially patterned to form first gate electrodes 125, and on the surface of the substrate 100 in the NMOS transistor region 112, the metal layer 141 and the second metal-containing layer 131 are sequentially patterned to form second gate electrodes 135.

The surface of the substrate 100 in the NMOS and PMOS transistor regions 112, 114 can be lightly implanted with n-type and p-type impurities, respectively. Spacers are then formed on side walls of the gate electrodes. And then, the surface of the substrate in the NMOS and PMOS transistor regions can be heavily implanted with the n-type and p-type impurities, respectively. Consequently, source/drain regions having a LDD or dual doped structure are obtained.

Here, it should be noted that in the invention described herein, the order of forming the first and second metal-containing layers can be changed without a difference in effect.

As apparent from the foregoing description, it can be appreciated that the present invention can prevent the poly-gate depletion problem and at the same time decrease the threshold voltage of transistors to drive them in high speed and low power consumption. Also, the present invention can form a CMOS type semiconductor device which can enhance the reliability of the gate insulation layer.

In the drawings and specification, there have been disclosed typical preferred embodiments of the invention and, although specific terms are employed, they are used in a generic and descriptive sense only and not for purpose of limitation, the scope of the invention being set forth in the following claims.

What is claimed is:

1. A method of forming a dual gate type semiconductor device comprising:
    forming a first gate insulation layer and a first metal-containing layer sequentially on a surface of a substrate in first and second impurity type transistor regions on which an isolation layer is formed, wherein the first metal-containing layer has a work function corresponding to the work function of silicon of the first impurity type;
    exposing said first gate insulation layer on said surface of said substrate in said second impurity type transistor region by selectively etching said first metal-containing layer anisotropically;
    removing said first gate insulation layer on said surface of said substrate in said second impurity type transistor region;
    forming a second gate insulation layer by selectively thermally oxidizing said surface of said substrate in said second impurity type transistor region in which said first gate insulation layer is removed;
    forming a second metal-containing layer over said surface of said substrate on which said second gate insulation layer is formed, wherein the second metal-containing layer has a work function corresponding to the work function of silicon of the second impurity type;
    forming a first gate electrode on said surface of said substrate in said first impurity type transistor region by patterning said second metal-containing layer and first metal-containing layer; and
    forming a second gate electrode on said surface of said substrate in said second impurity type transistor region by patterning said second metal-containing layer.

2. A method of forming a dual gate type semiconductor device comprising:
    forming a first gate insulation layer and a first metal-containing layer sequentially on a surface of a substrate in first and second impurity type transistor regions on which an isolation layer is formed, wherein the first metal-containing layer has a work function corresponding to the work function of silicon of the first impurity type;
    exposing said first gate insulation layer on said surface of said substrate in said second impurity type transistor region by selectively etching said first metal-containing layer anisotropically;
    removing said first gate insulation layer on said surface of said substrate in said second impurity type transistor region;
    forming a second gate insulation layer and a second metal-containing layer over the whole surface of said substrate on which said first gate insulation layer is removed, wherein the second metal-containing layer has a work function corresponding to the work function of silicon of the second impurity type;
    removing said second metal-containing layer and said second gate insulation layer over said surface of said substrate in said first impurity type transistor region while protecting them on said surface of said substrate in said second impurity type transistor region using a photo-resist pattern as an etch mask; and
    forming a first gate electrode on said surface of said substrate in said first impurity type transistor region by patterning said first metal-containing layer; and
    forming a second gate electrode on said surface of said substrate in said second impurity type transistor region by patterning said second metal-containing layer.

3. The method according to claim 1, wherein said first and second gate insulation layers are formed by oxidizing said substrate thermally.

4. The method according to claim 3, wherein said first metal-containing layer is formed of a material which does not form insulation oxides at said step of forming a second gate insulation layer.

5. The method according to claim 4, wherein:
    said second metal-containing layer is formed over the whole surface of said substrate including said second impurity type transistor region; and
    said steps of forming first and second gate electrodes are concurrently carried out through the same patterning process.

6. The method according to claim 1, wherein said first and second gate insulation layers are formed of a high dielectric layer comprising an insulation metal compound.

7. The method according to claim 6, wherein said high dielectric layer is formed of a material selected from the group consisting of $Al_2O_3$, $HfO_2$, $HfSiO_4$, $ZrO_2$, $ZrSiO_4$, and $La_2O_3$.

8. The method according to claim 1, further including forming a metal layer after forming a second metal-containing layer.

9. The method according to claim 1, wherein forming first and second gate electrodes are concurrently carried out through the same patterning process.

10. The method according to claim 1, wherein removing said first gate insulation layer is carried out by a wet etching process.

11. The method according to claim 1, further including removing said second metal-containing layer over said surface of said substrate in said first impurity type transistor region after forming said second metal-containing layer.

12. The method according to claim 11, wherein:

said second gate insulation layer and said second metal-containing layer are formed over the whole surface of said substrate and said second gate insulation layer acts as an etch stop layer in said step of removing said second metal-contained layer; and further including removing said second gate insulation layer over said surface of said substrate in said first impurity type transistor region after removing said second metal-containing layer.

13. The method according to claim 1, wherein a channel layer in said first impurity type transistor region is doped by an n-type impurity, and said first metal-contained layer is formed of a material selected from the group consisting of $RuO_2$, Mo, TaN, WN, Pt, Ir, and Ni.

14. The method according to claim 1, wherein a channel layer in said second impurity type transistor region is doped by a p-type impurity, and said second metal-contained layer is formed of a material selected from the group consisting of Ta, Zr, Hf and Ti.

15. The method according to claim 1, further including:

lightly doping said surface of said substrate in said first and second impurity transistor regions with p-type and n-type impurities, respectively;

forming spacers on side walls of said gate electrodes; and heavily doping said surface of said substrate in said first and second impurity transistor regions with said p-type and n-type impurities, respectively.

* * * * *